US012672427B2

(12) United States Patent (10) Patent No.: US 12,672,427 B2
Zuo et al. (45) Date of Patent: Jun. 30, 2026

(54) DISPLAY PANEL, PREPARATION METHOD THEREOF AND DISPLAY APPARATUS

(71) Applicant: BOE Technology Group Co., Ltd., Beijing (CN)

(72) Inventors: Pengfei Zuo, Beijing (CN); Guanyin Wen, Beijing (CN); Yanjun Hao, Beijing (CN); Hui Zhou, Beijing (CN); Qixiao Wu, Beijing (CN); Huameng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 387 days.

(21) Appl. No.: 18/577,163

(22) PCT Filed: Mar. 29, 2023

(86) PCT No.: PCT/CN2023/084689
§ 371 (c)(1),
(2) Date: Jan. 5, 2024

(87) PCT Pub. No.: WO2024/197638
PCT Pub. Date: Oct. 3, 2024

(65) Prior Publication Data
US 2025/0098403 A1 Mar. 20, 2025

(51) Int. Cl.
*H10K 50/19* (2023.01)
*H10K 50/13* (2023.01)
(Continued)

(52) U.S. Cl.
CPC ............. *H10K 50/19* (2023.02); *H10K 50/13* (2023.02); *H10K 59/1201* (2023.02); *H10K 59/122* (2023.02); *H10K 2102/351* (2023.02)

(58) Field of Classification Search
CPC .... H10K 50/19; H10K 50/13; H10K 59/1201; H10K 59/122; H10K 2102/351;
(Continued)

(56) References Cited

U.S. PATENT DOCUMENTS

| 2015/0034923 A1 | 2/2015 | Kim et al. |
| 2018/0047926 A1 | 2/2018 | Tanaka et al. |
| 2022/0020954 A1 | 1/2022 | Cai et al. |

FOREIGN PATENT DOCUMENTS

| CN | 102197507 A | 9/2011 |
| CN | 106920816 A | 7/2017 |

(Continued)

*Primary Examiner* — Mohammad A Rahman
(74) *Attorney, Agent, or Firm* — HOUTTEMAN LAW LLC

(57) ABSTRACT

A display panel, including a substrate, and a first electrode, at least two emission functional layers and a second electrode sequentially stacked on a side of the substrate, where for any two adjacent emission functional layers, one close to the substrate includes a first hole transport layer, a first emission layer, a first electron transport layer, and an N-type charge generation layer sequentially stacked away from the substrate, and the other away from the substrate includes a P-type charge generation layer, a second hole transport layer, a second emission layer, and a second electron transport layer sequentially stacked away from the N-type charge generation layer; the first electron transport layer has a thickness ranging from 3 nm to 10 nm; the first electron transport layer includes first, second and third subportions; and the first subportion has a thickness smaller than those of the second and third subportions.

20 Claims, 7 Drawing Sheets

100

(51) Int. Cl.
    *H10K 59/12*       (2023.01)
    *H10K 59/122*     (2023.01)
    *H10K 102/00*     (2023.01)

(58) Field of Classification Search
    CPC ...... H10K 50/166; H10K 50/10; H10K 50/16;
                      H10K 59/30; H10K 59/35
    See application file for complete search history.

(56)              References Cited

FOREIGN PATENT DOCUMENTS

| | | | | |
|---|---|---|---|---|
| CN | 107068718 A | 8/2017 | | |
| CN | 109275335 B | 10/2019 | | |
| CN | 108615817 B | 2/2020 | | |
| CN | 110828677 A | 2/2020 | | |
| CN | 114122087 A | 3/2022 | | |
| CN | 110998376 B | 6/2022 | | |
| CN | 115232153 A | 10/2022 | | |
| CN | 115295596 A | 11/2022 | | |
| KR | 20160079268 A | * | 7/2016 | ............ C09K 11/06 |
| TW | 202028423 A | 8/2020 | | |
| WO | WO 2016140180 A1 | 9/2016 | | |
| WO | WO 2021147059 A1 | 7/2021 | | |
| WO | WO 2022227438 A1 | 11/2022 | | |

* cited by examiner

DISPLAY PANEL, PREPARATION METHOD THEREOF AND DISPLAY APPARATUS

TECHNICAL FIELD

Embodiments of the present disclosure belong to the field of display technology, and specifically relate to a display panel, a preparation method thereof and a display apparatus.

BACKGROUND

With two or more emission layers, a tandem organic light-emitting diode (i.e., tandem OLED) device can achieve the same brightness with a smaller current compared with a traditional OLED device having a single emission layer, thereby effectively reducing the power consumption of the tandem OLED device and prolonging the service life of the tandem OLED device with such smaller current.

SUMMARY

In a first aspect, an embodiment of the present disclosure provides a display panel, including a substrate, a first electrode, at least two emission functional layers and a second electrode, wherein the first electrode, the at least two emission functional layers, and the second electrode are sequentially stacked on a side of the substrate:

for any two adjacent ones of the at least two emission functional layers, one of the emission functional layers close to the substrate includes a first hole transport layer, a first emission layer, a first electron transport layer, and an N-type charge generation layer, and the other of the emission functional layers away from the substrate includes a P-type charge generation layer, a second hole transport layer, a second emission layer, and a second electron transport layer;

the first hole transport layer, the first emission layer, the first electron transport layer, the N-type charge generation layer, the P-type charge generation layer, the second hole transport layer, the second emission layer and the second electron transport layer are sequentially stacked away from the substrate;

the first electron transport layer has a thickness ranging from 3 nm to 10 nm;

the first emission layer includes a first pattern, a second pattern, and a third pattern, wherein the first pattern, the second pattern, and the third pattern have orthographic projections on the substrate spaced apart from each other and emit light of different colors;

the first electron transport layer includes a first subportion, a second subportion and a third subportion which have orthographic projections on the substrate spaced apart from each other, wherein orthographic projections of the first subportion and the first pattern on the substrate are overlapped, orthographic projections of the second subportion and the second pattern on the substrate are overlapped, and orthographic projections of the third subportion and the third pattern on the substrate are overlapped; and the first subportion has a thickness smaller than a thickness of the second subportion, and the first subportion has a thickness smaller than a thickness of the third subportion.

In some embodiments, the first pattern emits blue light, the second pattern emits red light, and the third pattern emits green light, the first subportion has a thickness ranging from 3 nm to 5 nm;

the second subportion has a thickness ranging from 5 nm to 10 nm; and the third subportion has a thickness ranging from 5 nm to 10 nm.

In some embodiments, a side surface of the first subportion away from the substrate, a side surface of the second subportion away from the substrate, and a side surface of the third subportion away from the substrate are flush.

In some embodiments, the first emission layer includes a first pattern, a second pattern, and a third pattern, wherein the first pattern, the second pattern, and the third pattern have orthographic projections on the substrate spaced apart from each other and emit light of different colors;

the N-type charge generation layer includes a first subsection, a second subsection, and a third subsection which have orthographic projections on the substrate spaced apart from each other, wherein orthographic projections of the first subsection and the first pattern on the substrate are overlapped, orthographic projections of the second subsection and the second pattern on the substrate are overlapped, and orthographic projections of the third subsection and the third pattern on the substrate are overlapped.

In some embodiments, the first pattern emits blue light, the second pattern emits red light, and the third pattern emits green light, the first subsection is made of a material with a doping concentration of ytterbium or lithium ranging from 5% to 10%, the second subsection is made of a material with a doping concentration of ytterbium or lithium ranging from 1% to 5%, and the third subsection is made of a material with a doping concentration of ytterbium or lithium ranging from 1% to 5%.

In some embodiments, the first subsection, the second subsection, and the third subsection have the same thickness.

In some embodiments, side surfaces of the first subsection, the second subsection, and the third subsection away from the substrate are flush.

In some embodiments, the first pattern has a thickness ranging from 20 nm to 30 nm:

the second pattern has a thickness ranging from 45 nm to 60 nm; and the third pattern has a thickness ranging from 30 nm to 45 nm.

In some embodiments, the display panel includes a display area, wherein an orthographic projection of the N-type charge generation layer on the substrate covers the display area, and the N-type charge generation layer is made of a material including any two or more types of triazine compounds or carbazole derivatives, and ytterbium or lithium.

In some embodiments, in the material of the N-type charge generation layer, a doping ratio of ytterbium or lithium is ≤5%, and a doping ratio of a material better for improving an operating voltage rise of a tandem OLED device in the carbazole derivatives or triazine compounds is in a range of 10% to 40%.

In some embodiments, the display panel includes a display area, wherein the N-type charge generation layer includes a first sublayer and a second sublayer sequentially stacked away from the substrate, orthographic projections of the first sublayer and the second sublayer on the substrate cover the display area, and the first sublayer and the second sublayer are made of different materials.

In some embodiments, the first sublayer is made of a material including any one or more types of ytterbium- or lithium-doped triazine compounds or carbazole derivatives, and the second sublayer is made of a material including any one or more types of ytterbium- or lithium-doped carbazole derivatives or triazine compounds.

In some embodiments, a doping concentration of ytterbium or lithium in the first sublayer is in a range of 1% to 3%, and a doping concentration of ytterbium or lithium in the second sublayer is in a range of 1% to 5%.

In some embodiments, the display panel includes a display area, wherein an orthographic projection of the first electron transport layer on the substrate covers the display area, and an orthographic projection of the second hole transport layer on the substrate covers the display area, and the second hole transport layer has a thickness ranging from 20 nm to 40 nm.

In some embodiments, the display panel further includes a hole injection layer and an electron injection layer, wherein the hole injection layer is between the first electrode and one of the at least two emission functional layers closest to the substrate, and the electron injection layer is on a side, of one of the at least two emission functional layers farthest from the substrate, away from the substrate.

In some embodiments, the second emission layer includes a fourth pattern, a fifth pattern, and a sixth pattern, wherein the fourth pattern, the fifth pattern, and the sixth pattern have orthographic projections on the substrate spaced apart from each other and emit light of different colors;

the fourth pattern and the first pattern have overlapped orthographic projections on the substrate and emit light of the same color, the fifth pattern and the second pattern have overlapped orthographic projections on the substrate and emit light of the same color, the sixth pattern and the third pattern have overlapped orthographic projections on the substrate and emit light of the same color.

In some embodiments, the display panel further includes a first pixel defining layer and a second pixel defining layer, wherein the first pixel defining layer is in the same layer as the first emission layer, and has a shape complementary to the first emission layer; and the second pixel defining layer is in the same layer as the second emission layer, and has a shape complementary to the second emission layer.

In a second aspect, an embodiment of the present disclosure further provides a display apparatus, including the display panel as described above.

In a third aspect, an embodiment of the present disclosure further provides a method for preparing a display panel, including: preparing a substrate, and sequentially preparing a first electrode, at least two emission functional layers and a second electrode on a side of the substrate: wherein preparing any two adjacent ones of the at least two emission functional layers includes sequentially preparing one emission functional layer close to the substrate and the other emission functional layer away from the substrate;

preparing the one emission functional layer close to the substrate includes: sequentially preparing a first hole transport layer, a first emission layer, a first electron transport layer, and an N-type charge generation layer;

preparing the other emission functional layer away from the substrate includes: sequentially preparing a P-type charge generation layer, a second hole transport layer, a second emission layer, and a second electron transport layer;

the first electron transport layer has a thickness ranging from 3 nm to 10 nm;

preparing the first emission layer includes preparing a first pattern, a second pattern, and a third pattern, wherein the first pattern, the second pattern, and the third pattern have orthographic projections on the substrate spaced apart from each other and emit light of different colors;

preparing the first electron transport layer includes preparing a first subportion, a second subportion, and a third subportion, wherein the first subportion, the second subportion, and the third subportion have orthographic projections on the substrate spaced apart from each other, wherein orthographic projections of the first subportion and the first pattern on the substrate are overlapped, orthographic projections of the second subportion and the second pattern on the substrate are overlapped, and orthographic projections of the third subportion and the third pattern on the substrate are overlapped; and the first subportion has a thickness smaller than a thickness of the second subportion, and the first subportion has a thickness smaller than a thickness of the third subportion.

In some embodiments, the first hole transport layer, the first electron transport layer, the N-type charge generation layer, the P-type charge generation layer, the second hole transport layer, and the second electron transport layer are formed, respectively, through evaporating with a common metal mask having one opening; and forming the first emission layer and the second emission layer are formed, respectively, through evaporating with a fine metal mask having a plurality of openings.

In some embodiments, the first hole transport layer, the N-type charge generation layer, the P-type charge generation layer, the second hole transport layer, and the second electron transport layer are formed, respectively, through evaporating with a common metal mask having one opening; and the first emission layer, the first electron transport layer, and the second emission layer are formed, respectively, through evaporating with a fine metal mask having a plurality of openings.

In some embodiments, the first electron transport layer, the P-type charge generation layer, the second hole transport layer, and the second electron transport layer are formed, respectively, through evaporating with a common metal mask having one opening:

the first emission layer, the second emission layer, and the N-type charge generation layer are formed, respectively, through evaporating with a fine metal mask having a plurality of openings; and the first electron transport layer is formed, through evaporating with a common metal mask having one opening, or a fine metal having a plurality of openings.

In some embodiments, forming the first emission layer through evaporating with the fine metal mask having a plurality of openings includes:

forming the first pattern of the first emission layer, through evaporating with a first fine metal mask:

through evaporating with a second fine metal mask forming the second pattern of the first emission layer; and forming the third pattern of the first emission layer, through evaporating with a third fine metal mask; and forming the first electron transport layer through evaporating with the fine metal mask having a plurality of openings includes:

forming the first subportion of the first electron transport layer, through evaporating with the first fine metal mask:

forming the second subportion of the first electron transport layer, through evaporating with the second fine metal mask; and forming the third subportion of the first electron transport layer, through evaporating with the third fine metal mask.

In some embodiments, forming the first emission layer through evaporating with the fine metal mask having a plurality of openings includes:

forming the first pattern of the first emission layer, through evaporating with a first fine metal mask:

forming the second pattern of the first emission layer, through evaporating with a second fine metal mask; and forming the third pattern of the first emission layer, through evaporating with a third fine metal mask; and forming the N-type charge generation layer through evaporating with the fine metal mask having a plurality of openings includes:

forming a first subsection of the N-type charge generation layer, through evaporating with the first fine metal mask:

forming a second subsection of the N-type charge generation layer, through evaporating with the second fine metal mask; and forming a third subsection of the N-type charge generation layer, through evaporating with the third fine metal mask.

In some embodiments, forming the N-type charge generation layer by evaporation includes:

evaporating any two or more types of triazine compounds or carbazole derivatives, and ytterbium or lithium simultaneously through a plurality of evaporation sources, to control an evaporation rate of each evaporation source so that in the formed N-type charge generation layer, a doping ratio of a material better for improving an operating voltage rise of a tandem OLED device in the carbazole derivatives or triazine compounds is in a range of 10% to 40%, and a doping ratio of ytterbium or lithium is ≤5%.

In some embodiments, forming the N-type charge generation layer by evaporation includes:

sequentially forming a first sublayer and a second sublayer by evaporation:

forming the first sublayer by evaporation includes:

evaporating any one or more types of triazine compounds or carbazole derivatives, and ytterbium or lithium simultaneously through a plurality of evaporation sources; and controlling an evaporation rate of each evaporation source so that a doping concentration of ytterbium or lithium in the formed first sublayer is in a range of 1% to 3%; and forming the second sublayer by evaporation includes:

evaporating any one or more types of carbazole derivatives or triazine compounds, and ytterbium or lithium simultaneously through a plurality of evaporation sources; and controlling an evaporation rate of each evaporation source so that a doping concentration of ytterbium or lithium in the formed second sublayer is in a range of 1% to 5%.

BRIEF DESCRIPTION OF DRAWINGS

Accompanying drawings are provided for further understanding of the embodiments of the present disclosure and constitute a part of the specification. Hereinafter, these drawings are intended to explain the present disclosure together with the following embodiments, but should not be considered as a limitation to the present disclosure. The above and other features and advantages will become more apparent to those skilled in the art by describing in detail example embodiments thereof with reference to the attached drawings, in which.

DETAIL DESCRIPTION OF EMBODIMENTS

Figure 1A:
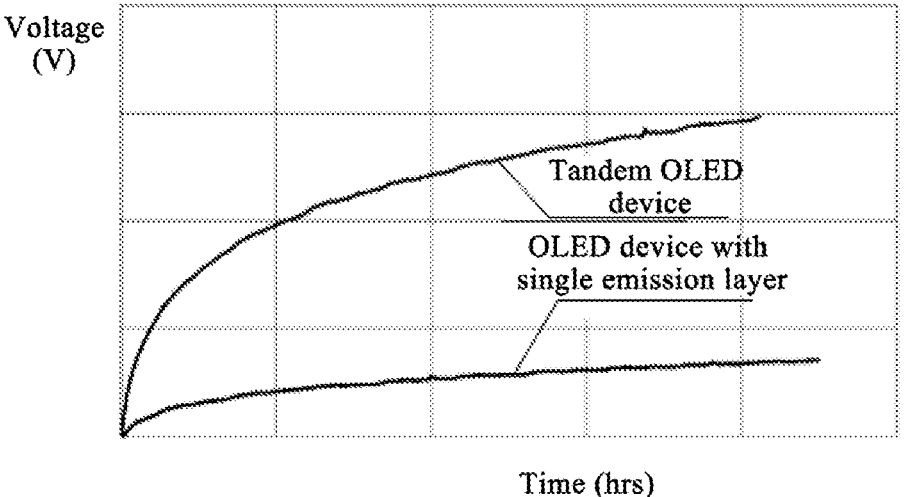
FIG. 1*a* is a graph showing operating voltage rises with time for a tandem OLED device and an OLED device with single emission layer.

In order to make those skilled in the art better understand the technical solutions in the embodiments of the present disclosure, the display panel, the preparation method thereof and the display apparatus provided in the embodiments of the present disclosure will be described in further detail below with reference to the accompanying drawings and specific implementations.

Embodiments of the present disclosure will be described more sufficiently below with reference to the accompanying drawings, which may be embodied in different forms and should not be construed as being limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but further include modifications of configurations formed based on a manufacturing process. Thus, the regions illustrated in the figures have schematic properties, and the shapes of the regions shown in the figures illustrate specific shapes of regions, but are not intended to be limitative.

In the existing art, although the tandem OLED device can effectively reduce the power consumption of the device and prolong the lifetime of the device, the multiple emission layers of the tandem OLED device lead to an operating voltage much higher than that of an OLED device with single emission layer. As time goes by, the operating voltage of the tandem OLED device gradually increases, with an amplitude more than twice that of the OLED device with single emission layer under the same condition (referring to FIG. 1a, which is a graph showing operating voltage rises with time for a tandem OLED device and an OLED device with single emission layer).

Figure 1B:
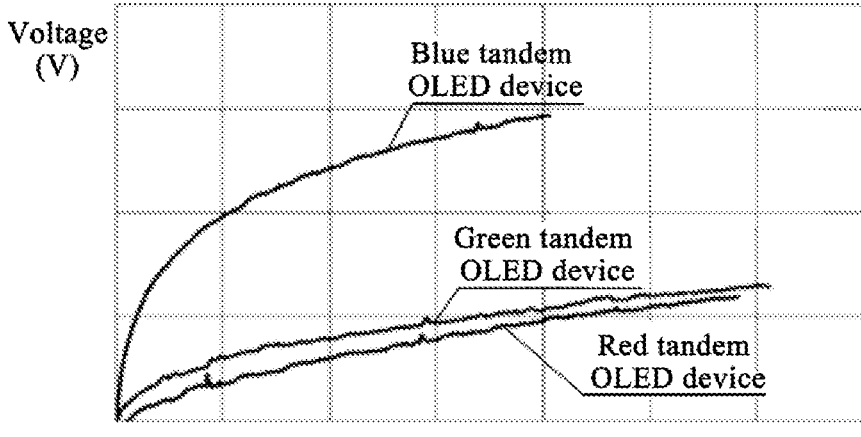
FIG. 1*b* is a graph showing operating voltage rises with time for red, green and blue tandem OLED devices.

The large rises of the operating voltage of the tandem OLED device with time not only pose higher requirements on transistors in a driving backplane (i.e., an array substrate for driving the OLED device to emit light, in which a circuit for driving the OLED device to emit light is integrated, the circuit including transistors, capacitors, and other elements), but also has adverse effects on reducing the power consumption of the device. In addition, different colors (such as red, green, and blue) of tandem OLED devices may lead to different voltage rises. Referring to FIG. 1b, which is a graph showing operating voltage rises with time for red, green and blue tandem OLED devices, the blue tandem OLED device is most sensitive, so that the operating voltage rise of the blue tandem OLED device with time is more obvious compared with the red and green tandem OLED devices. In this case, the operating voltage rise of the blue tandem OLED device with time is the largest, so that the blue tandem OLED device has the most reduced current and the most attenuated light intensity, which may cause a display panel with the red, green and blue tandem OLED device structures to generate yellow or green light in operation, thereby adversely affecting the display effect of the display panel.

Figure 2A:
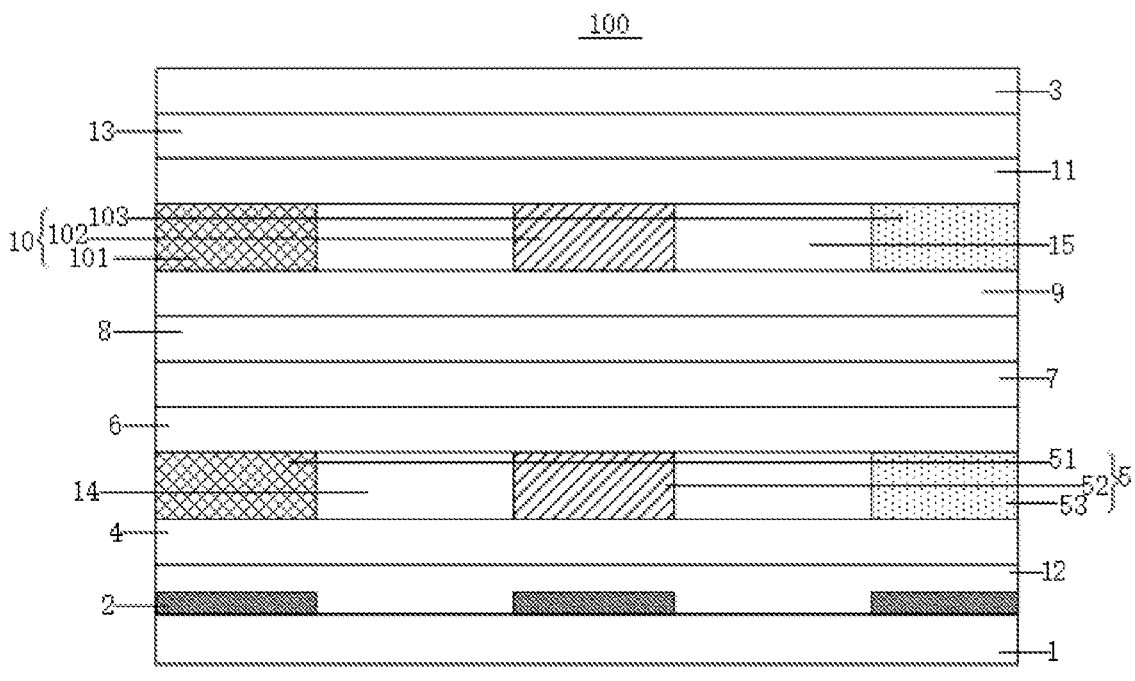
FIG. 2*a* is a schematic sectional view showing a structure of a display panel according to an embodiment of the present disclosure.

In order to solve the above problems in the existing art, in a first aspect, an embodiment of the present disclosure provides a display panel. Referring to FIG. 2a, a schematic sectional view showing a structure of a display panel according to an embodiment of the present disclosure is shown. The display panel includes a substrate 1, a first electrode 2, at least two emission functional layers and a second electrode 3. The first electrode 2, the at least two emission functional layers, and the second electrode 3 are sequentially stacked on a side of the substrate 1. For any two adjacent emission functional layers, one of the emission functional layers close to the substrate 1 includes a first hole transport layer 4, a first emission layer 5, a first electron transport layer 6, and an N-type charge generation layer 7, and the other of the emission functional layers away from the substrate 1 includes a P-type charge generation layer 8, a second hole transport layer 9, a second emission layer 10, and a second electron transport layer 11. The first hole transport layer 4, the first emission layer 5, the first electron transport layer 6, the N-type charge generation layer 7, the P-type charge generation layer 8, the second hole transport layer 9, the second emission layer 10, and the second electron transport layer 11 are sequentially stacked away from the substrate 1. The first electron transport layer 6 has a thickness ranging from 3 nm to 10 nm.

In some embodiments, the first emission layer 5 includes a first pattern 51, a second pattern 52, and a third pattern 53 which have orthographic projections on the substrate spaced apart from each other and emit light of different colors.

In some embodiments, the second emission layer 10 includes a fourth pattern 101, a fifth pattern 102, and a sixth pattern 103 which have orthographic projections on the substrate spaced apart from each other and emit light of different colors. The fourth pattern 101 and the first pattern 51 have overlapped orthographic projections on the substrate 1 and emit light of the same color, the fifth pattern 102 and the second pattern 52 have overlapped orthographic projections on the substrate 1 and emit light of the same color, and the sixth pattern 103 and the third pattern 53 have overlapped orthographic projections on the substrate 1 and emit light of the same color.

In some embodiments, the first pattern 51, the second pattern 52, the third pattern 53, the fourth pattern 101, the fifth pattern 102, and the sixth pattern 103 are each made of an organic electroluminescent material.

In some embodiments, the first pattern 51 emits blue light, the second pattern 52 emits red light, and the third pattern 53 emits green light. In this embodiment, the first pattern 51, the fourth pattern 101, and other film layers in the emission functional layers are stacked to form a blue tandem OLED device, the second pattern 52, the fifth pattern 102, and other film layers in the emission functional layers are stacked to form a red tandem OLED device, and the third pattern 53, the sixth pattern 103, and other film layers in the emission functional layers are stacked to form a green tandem OLED device.

Figure 2B:
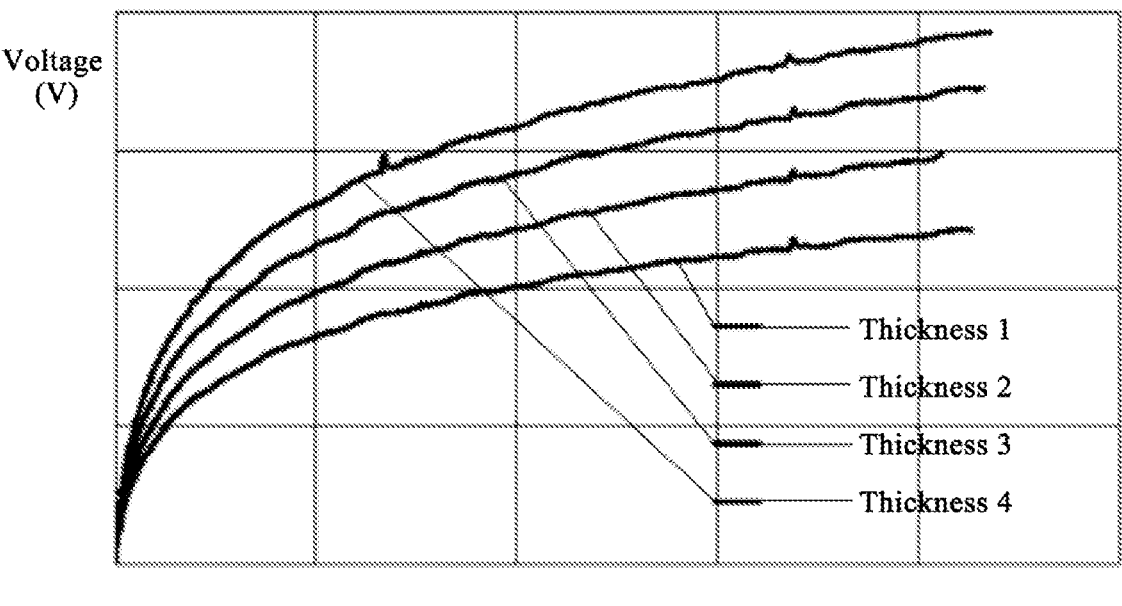
FIG. 2*b* is a graph showing operating voltage rises with time for display panels with different thicknesses of first electron transport layers.

Referring to FIG. 2b, a graph showing operating voltage rises with time for display panels with different thicknesses of first electron transport layer is shown. As can be seen from FIG. 2b, the first electron transport layer 6 has four thicknesses: thickness 1<thickness 2<thickness 3<thickness 4, and as can be seen from the curves in FIG. 2b, the first electron transport layer 6 with a properly reduced thickness can effectively improve the problem of severe operating voltage rise of the display panel with time.

Referring to FIG. 2b and table 1, table 1 shows various performance parameters of the blue tandem OLED device with different thicknesses of the first electron transport layer.

TABLE 1

|  | Voltage | Efficiency | Lifetime |
| --- | --- | --- | --- |
| Thickness 1 | 99% | 100% | 98% |
| Thickness 2 | 100% | 101% | 95% |
| Thickness 3 | 100% | 99% | 99% |
| Thickness 4 | 100% | 100% | 100% |

As can be seen from table 1, the first electron transport layer 6 with a properly reduced thickness has little effect on the operating voltage, efficiency and lifetime of the blue tandem OLED device over time. Therefore, the first electron transport layer 6 with a reduced thickness can effectively improve the problem of severe operating voltage rise of the blue tandem OLED device with time, and since the operating voltage rise of the blue tandem OLED device with time is the largest in the existing art, the improvement in the operating voltage rise of the blue tandem OLED device obtained by thinning the first electron transport layer 6 is obviously greater than that of the red tandem OLED device and that of the green tandem OLED device, so that the operating voltage rises of the red, green and blue tandem OLED devices with time tend to be consistent, and the risk of poor display of the display panel is further reduced.

In this embodiment, by limiting the thickness of the first electron transport layer 6 to 3 nm to 10 nm, the first electron transport layer 6 has a reduced thickness compared with a display panel with a tandem OLED device structure in the existing art, which can not only effectively improve the problem of severe operating voltage rise of the display panel with time, but also reduce the differences in operating voltage rises of different colors of tandem OLED devices with time while reducing the influence on the performance of the tandem OLED devices as much as possible, so that the operating voltage rises of different colors of tandem OLED devices with time tend to be consistent, and the risk of poor display of the display panel is further reduced.

In some embodiments, the substrate 1 includes a pixel driving circuit which may be a 3T1C (i.e., three transistors and one capacitor) structure, a 7T1C (i.e., seven transistors and one capacitor) structure, or a circuit structure including other numbers of transistors and capacitors, such as a 7T2C structure, a 6T1C structure, a 6T2C structure, or a 9T2C structure. The pixel driving circuit includes a driving transistor having a source or drain electrically connected to the first electrode 2 to provide a driving current for the OLED device formed of the first electrode 2, the at least two emission functional layers and the second electrode 3 in stack.

In some embodiments, referring to FIG. 2a, the display panel further includes a hole injection layer 12 and an electron injection layer 13. The hole injection layer 12 is between the first electrode 2 and one of the emission functional layers closest to the substrate 1, and the electron injection layer 13 is located on a side, of one of the emission functional layers farthest from the substrate 1, away from the substrate 1.

In some embodiments, referring to FIG. 2a, the display panel further includes a first pixel defining layer 14 and a second pixel defining layer 15. The first pixel defining layer 14 is disposed in the same layer as the first emission layer 5, and has a shape complementary to the first emission layer 5. The second pixel defining layer 15 is disposed in the same layer as the second emission layer 10, and has a shape complementary to the second emission layer 10.

Figure 2C:
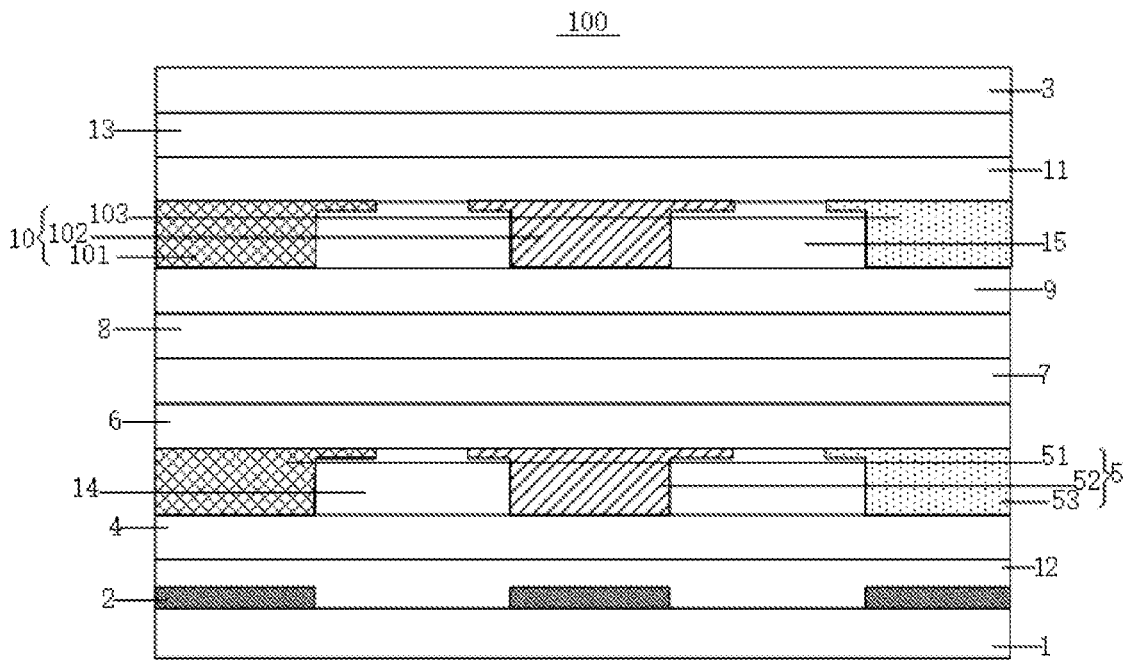
FIG. 2*c* is a schematic diagram showing another arrangement of emission layers and pixel defining layers according to an embodiment of the present disclosure.

In some embodiments, referring to FIG. 2c, which is a schematic diagram showing another arrangement of emission layers and pixel defining layers according to an embodiment of the present disclosure, the first pixel defining layer 14 is provided with a first opening into which most of the first emission layer 5 is received, a peripheral part of the first emission layer 5 is located on a side of the first pixel defining layer 14 away from the substrate 1, and an orthographic projection of the peripheral part of the first emission layer 5 on the substrate I overlaps that of the first pixel defining layer 14. The second pixel defining layer 15 is provided with a second opening into which most of the second emission layer 10 is received, a peripheral part of the second emission layer 10 is located on a side of the second pixel defining layer 15 away from the substrate 1, and an orthographic projection of the peripheral part of the second emission layer 10 on the substrate I overlaps that of the second pixel defining layer 15.

In some embodiments, referring to FIG. 2a, the display panel includes a display area 100. An orthographic projection of the first electron transport layer 6 on the substrate 1 covers the display area 100, an orthographic projection of the second hole transport layer 9 on the substrate I covers the display area 100, and the second hole transport layer 9 has a thickness ranging from 20 nm to 40 nm.

In this embodiment, since the first electron transport layer 6 is thinned, a microcavity length (i.e., a distance between a side surface of the first electrode 2 away from the substrate I and a side surface of the second electrode 3 close to the substrate 1) of the tandem OLED device in the display panel is reduced, which may have a certain influence on the performance (such as the light-emitting efficiency, the voltage, and the lifetime) of the tandem OLED device. In order to solve the above problem caused by the reduced microcavity length of the tandem OLED device, the second hole transport layer 9 is designed to have a thickness ranging from 20 nm to 40 nm, so that the second hole transport layer 9 is thickened compared with the second hole transport layer 9 in the existing art to compensate for the microcavity length of the tandem OLED device, thereby avoiding the influence on the performance of the tandem OLED device.

Figure 3:
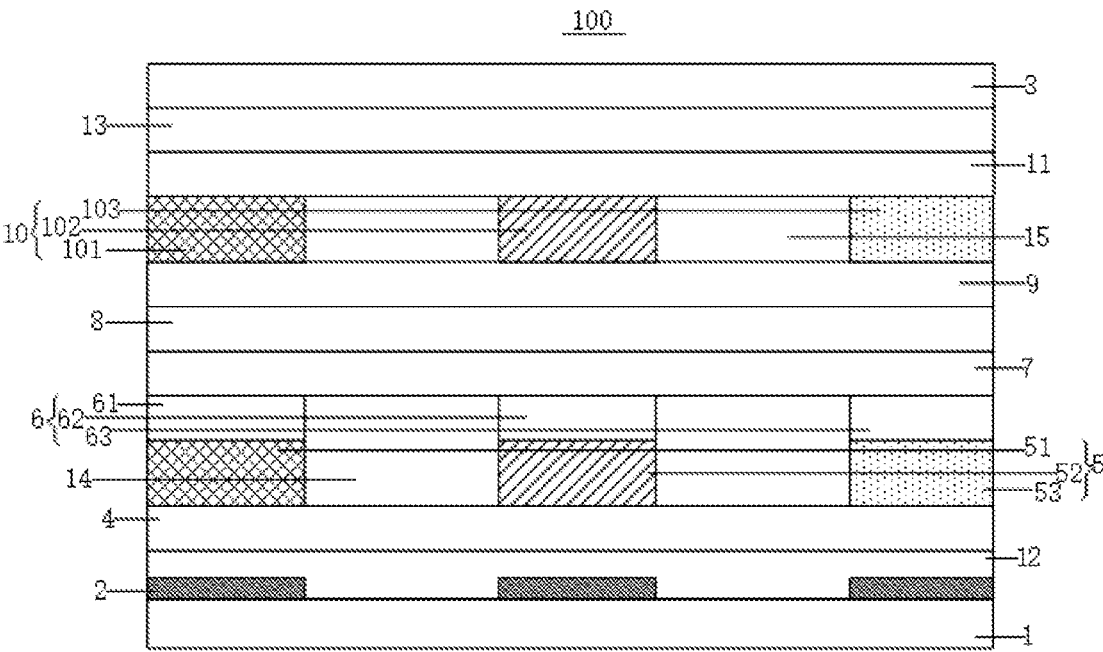
FIG. 3 is a schematic sectional view showing a structure of another display panel according to an embodiment of the present disclosure.

In some embodiments, referring to FIG. 3, which is a schematic sectional view showing a structure of another display panel according to an embodiment of the present disclosure, the first electron transport layer 6 includes a first subportion 61, a second subportion 62 and a third subportion 63 which have orthographic projections on the substrate spaced apart from each other. Orthographic projections of the first subportion 61 and the first pattern 51 on the substrate I are overlapped, orthographic projections of the second subportion 62 and the second pattern 52 on the substrate 1 are overlapped, and orthographic projections of the third subportion 63 and the third pattern 53 on the substrate 1 are overlapped. The first subportion 61 has a thickness smaller than a thickness of the second subportion 62, and the first subportion 61 has a thickness smaller than a thickness of the third subportion 63.

In some embodiments, referring to FIG. 3, orthographic projections of the first subportion 61 and the first pattern 51 on the substrate 1 coincide, orthographic projections of the second subportion 62 and the second pattern 52 on the substrate 1 coincide, and orthographic projections of the third subportion 63 and the third pattern 53 on the substrate 1 coincide.

In this embodiment, since the red, green and blue tandem OLED devices have different operating voltage rises with time, by isolating the first electron transport layers 6 in different colors of tandem OLED devices from each other and providing differently thinned first electron transport layers 6 in different colors of tandem OLED devices, the operating voltage rises of different colors of tandem OLED devices with time can be adjusted to tend to be consistent, thereby ensuring a good display effect of the display panel.

In some embodiments, the first subportion 61 has a thickness ranging from 3 nm to 5 nm: the second subportion 62 has a thickness ranging from 5 nm to 10 nm; and the third subportion 63 has a thickness ranging from 5 nm to 10 nm.

Since the operating voltage rise of the blue tandem OLED device with time is greater than that of the red tandem OLED device and that of the green tandem OLED device, the thinnest first subportion 61 is provided in the blue tandem OLED device, while the second subportion 62 in the red tandem OLED device and the third subportion 63 in the green tandem OLED device have substantially the same thickness, so that by providing differently thinned first electron transport layers 6 in different colors of tandem OLED devices, the operating voltage rises of different colors of tandem OLED devices with time are adjusted to tend to be consistent, thereby ensuring a good display effect of the display panel.

In some embodiments, the first pattern 51 has a thickness ranging from 20 nm to 30 nm, the second pattern 52 has a thickness ranging from 45 nm to 60 nm, and the third pattern 53 has a thickness ranging from 30 nm to 45 nm.

Since the first electron transport layers 6 in different colors of tandem OLED devices are differently thinned, microcavity lengths (i.e., a microcavity length being a distance between a side surface of the first electrode 2 away from the substrate 1 and a side surface of the second electrode 3 close to the substrate 1) of different colors of tandem OLED devices in the display panel are reduced differently, which may have a certain influence on the performance (such as the light-emitting efficiency, the voltage, and the lifetime) of different colors of tandem OLED devices. In order to solve the above problem caused by the reduced microcavity lengths of different colors of tandem OLED devices, the first pattern 51 is designed to have a thickness ranging from 20 nm to 30 nm, the second pattern 52 is designed to have a thickness ranging from 45 nm to 60 nm, and the third pattern 53 is designed to have a thickness ranging from 30 nm to 45 nm, so that the different colors of emission patterns in the first emission layer 5 are thickened compared with the different colors of emission patterns in the existing art to compensate for the microcavity lengths of different colors of tandem OLED devices, respectively, thereby avoiding the influence on the performance of different colors of tandem OLED devices.

In some embodiments, referring to FIG. 3, a side surface of the first subportion 61 away from the substrate 1, a side surface of the second subportion 62 away from the substrate 1, and a side surface of the third subportion 63 away from the substrate 1 are flush. In this manner, different colors of tandem OLED devices in the display panel can be conveniently encapsulated.

Figure 4A:
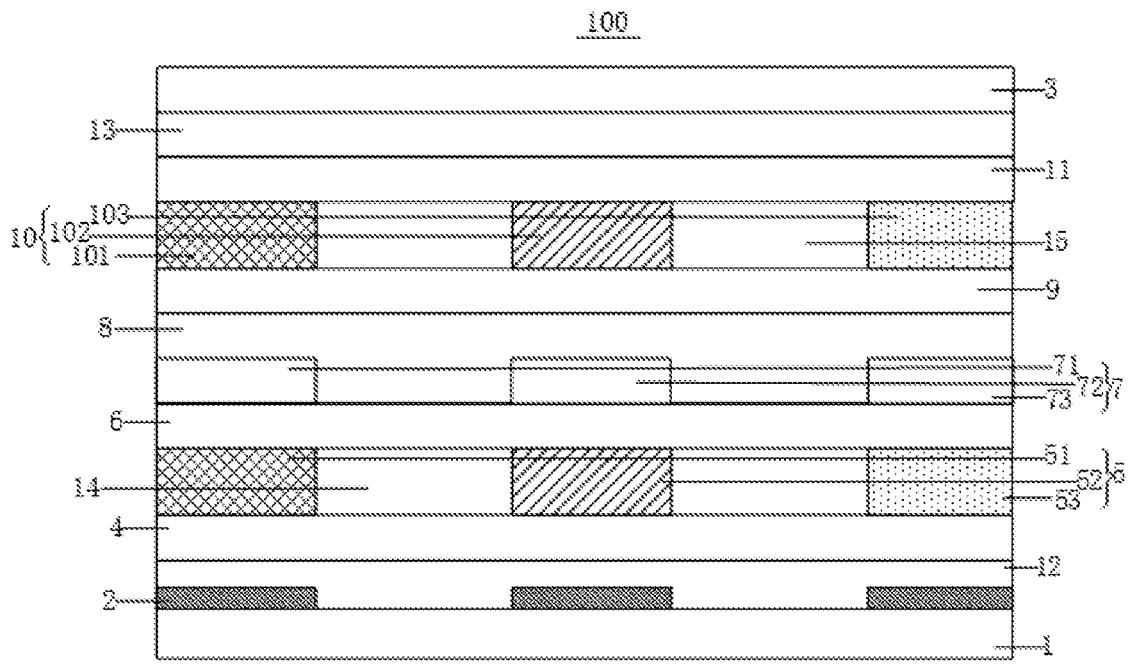
FIG. 4*a* is a schematic sectional view showing a structure of another display panel according to an embodiment of the present disclosure.
Figure 4B:
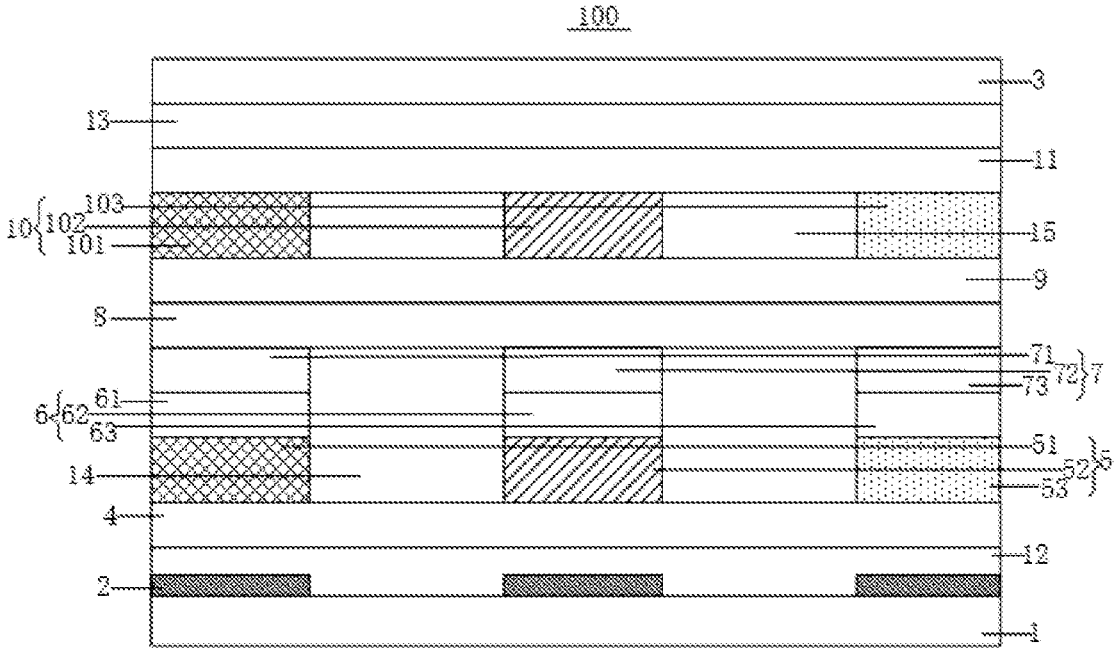
FIG. 4*b* is a schematic sectional view showing a structure of another display panel according to an embodiment of the present disclosure.

In some embodiments, referring to FIGS. 4a and 4b, where FIG. 4a is a schematic sectional view showing a structure of another display panel according to an embodiment of the present disclosure, and FIG. 4b is a schematic sectional view showing a structure of another display panel according to an embodiment of the present disclosure, the N-type charge generation layer 7 includes a first subsection 71, a second subsection 72, and a third subsection 73 which have orthographic projections on the substrate spaced apart from each other. Orthographic projections of the first subsection 71 and the first pattern 51 on the substrate I are overlapped, orthographic projections of the second subsection 72 and the second pattern 52 on the substrate 1 are overlapped, and orthographic projections of the third subsection 73 and the third pattern 53 on the substrate 1 are overlapped.

In some embodiments, referring to FIGS. 4a and 4b, orthographic projections of the first subsection 71 and the first pattern 51 on the substrate 1 coincide, orthographic projections of the second subsection 72 and the second pattern 52 on the substrate 1 coincide, and orthographic projections of the third subsection 73 and the third pattern 53 on the substrate 1 coincide.

Different colors of tandem OLED devices in the current display panel have a crosstalk problem with each other, which is due to the laying of the N-type charge generation layer 7 in full layer in the display panel that tends to cause crosstalk between adjacent tandem OLED devices. In this embodiment, the crosstalk between the adjacent tandem OLED devices can be addressed by dividing the N-type charge generation layer 7 into the first subsection 71, the second subsection 72, and the third subsection 73 spaced apart from each other.

In some embodiments, the first subsection 71 is made of a material with a doping concentration of ytterbium or lithium ranging from 5% to 10%, the second subsection 72 is made of a material with a doping concentration of ytterbium or lithium ranging from 1% to 5%, and the third subsection 73 is made of a material with a doping concentration of ytterbium or lithium ranging from 1% to 5%.

Figure 4C:
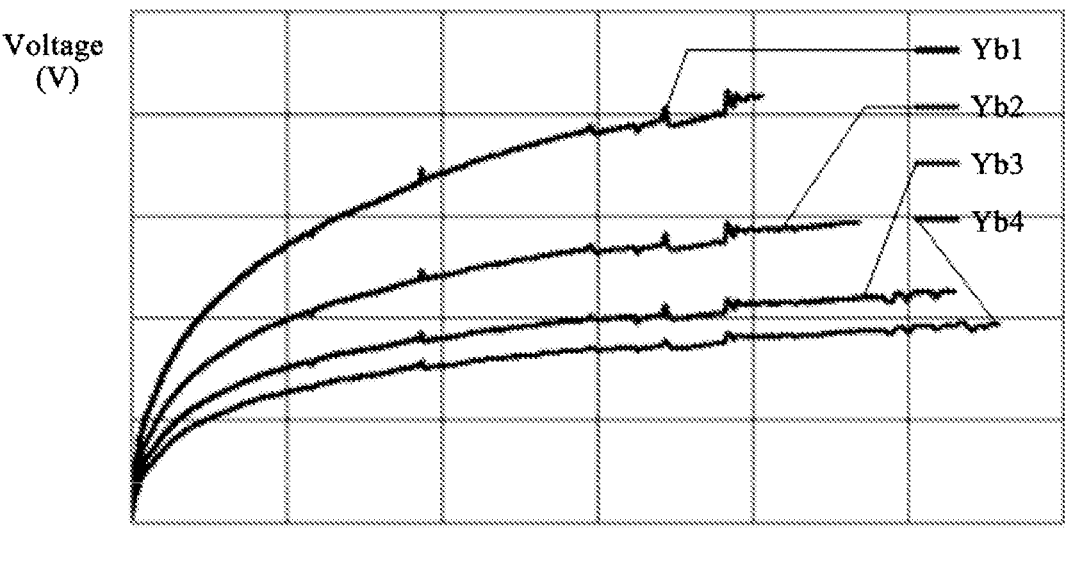
FIG. 4*c* is a graph showing operating voltage rises of tandem OLED devices with decreasing doping concentrations of ytterbium in the N-type charge generation layers.

The current material for the N-type charge generation layer 7 is typically doped with ytterbium or lithium (Yb/Li), and the leakage level of the tandem OLED device can be reduced by reducing the doping concentration of ytterbium or lithium in the N-type charge generation layer 7. However, the reduced doping concentration of ytterbium or lithium may cause great operating voltage rise of the tandem OLED device with time, leading to increased power consumption of the tandem OLED device. Referring to FIG. 4c, a graph showing operating voltage rises of tandem OLED devices with decreasing doping concentrations of ytterbium in the N-type charge generation layers is shown. In FIG. 4c, the doping concentrations of ytterbium are $Yb1 < Yb2 < Yb3 < Yb4$. As can be seen, the operating voltages of the tandem OLED devices rise notably as the doping concentration of ytterbium decreases.

In this embodiment, by providing the first subsection 71 made of a material with a doping concentration of ytterbium or lithium ranging from 5% to 10%, the second subsection 72 made of a material with a doping concentration of ytterbium or lithium ranging from 1% to 5%, and the third subsection 73 made of a material with a doping concentration of ytterbium or lithium ranging from 1% to 5%, the doping concentrations of ytterbium or lithium in the N-type charge generation layers 7 of different colors of tandem OLED devices are adjusted so that the doping concentrations of ytterbium or lithium in the first subsection 71, the second subsection 72 and the third subsection 73 are appropriately increased compared with the existing art, which, on one hand, can ensure a relatively low leakage level of different colors of tandem OLED devices in the display panel, and, on the other hand, can make the operating voltage rises of different colors of tandem OLED devices with time tend to be consistent, thereby ensuring a good display effect of the display panel.

In some embodiments, the first subsection 71, the second subsection 72, and the third subsection 73 have the same thickness. In this manner, normal performance of different colors of tandem OLED devices is ensured.

In some embodiments, side surfaces of the first subsection 71, the second subsection 72, and the third subsection 73 away from the substrate I are flush. In this manner, different colors of tandem OLED devices in the display panel can be conveniently encapsulated.

In some embodiments, referring to FIG. 2a, an orthographic projection of the N-type charge generation layer 7 on the substrate 1 covers the display area 100, and the N-type charge generation layer 7 is made of a material including any two or more types of triazine compounds or carbazole derivatives, and ytterbium or lithium.

Figure 5A:
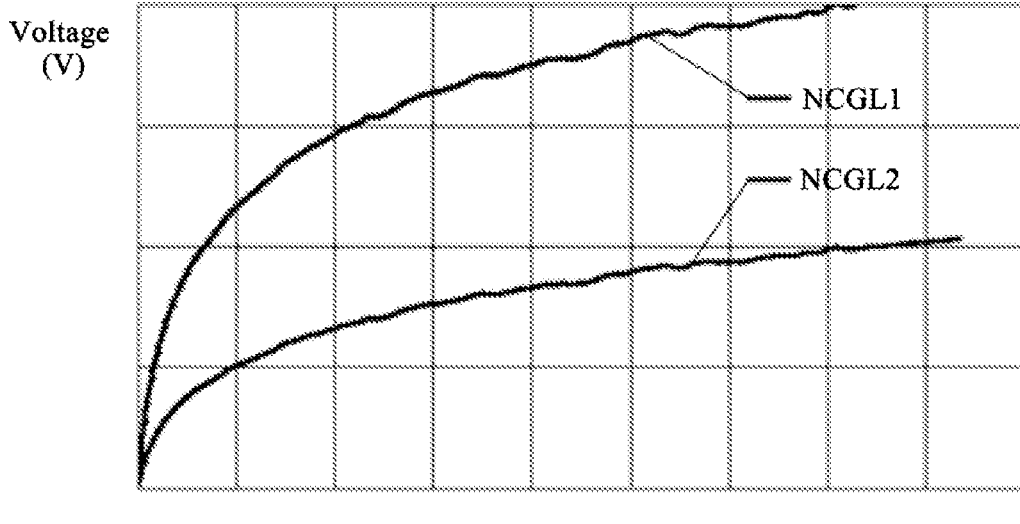
FIG. 5*a* is a graph showing a comparison between operating voltage rises of two tandem OLED devices with different materials of N-type charge generation layers.
Figure 5B:
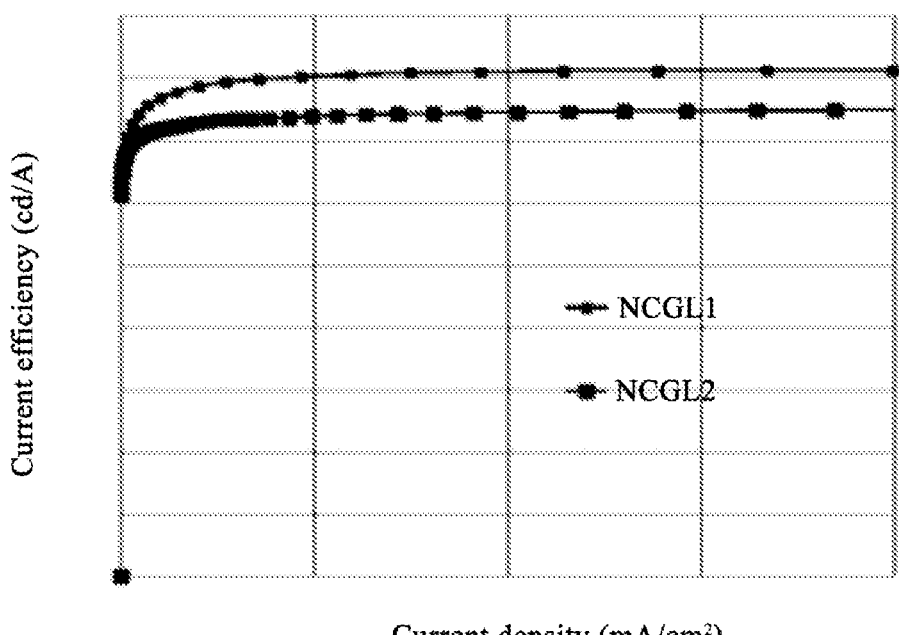
FIG. 5*b* is a graph showing a comparison between efficiencies of two tandem OLED devices with different materials of N-type charge generation layers.

Depending on the material selected for the N-type charge generation layer 7, the operating voltage rise of the tandem OLED device including that N-type charge generation layer with time may also differ greatly. Referring to FIGS. 5a and 5b, FIG. 5a is a graph showing a comparison between operating voltage rises of two tandem OLED devices with different materials of N-type charge generation layers, and FIG. 5b is a graph showing a comparison between efficiencies of two tandem OLED devices with different materials of N-type charge generation layers. As can be seen from FIG. 5a, the material NCGL2 is significantly better than the material NCGL1 in terms of improving the operating voltage rise of the tandem OLED device; and as can be seen in FIG. 5b, the material NCGL2 is worse than the material NCGL1 in terms of increasing the efficiency of the tandem OLED device.

In this embodiment, by using any two types of triazine compounds or carbazole derivatives in preparation of the N-type charge generation layer 7, the problem of operating voltage rise of the tandem OLED device with time can be solved while the efficiency of the tandem OLED device is ensured.

In some embodiments, three or more types of triazine compounds or carbazole derivatives may be used to prepare the N-type charge generation layer 7, as long as the problem of operating voltage rise of the tandem OLED device with time can be solved while the efficiency of the tandem OLED device is ensured.

In some embodiments, in the material of the N-type charge generation layer 7, a doping ratio of ytterbium or lithium is ≤5%, and a doping ratio of a material better for improving the operating voltage rise of the tandem OLED device in the carbazole derivatives or triazine compounds is in a range of 10% to 40%. In this manner, the doping ratio of ytterbium or lithium can ensure a relatively low leakage level of the tandem OLED device. By adjusting the proportions of two or more than three materials used in preparation of the N-type charge generation layer 7, a doping ratio of a material better for improving the operating voltage rise of the tandem OLED device in the N-type charge generation layer 7 is adjusted to in a range of 10% to 40%, so that the problem of operating voltage rise of the tandem OLED device with time can be solved while the efficiency of the tandem OLED device is ensured.

Figure 6:
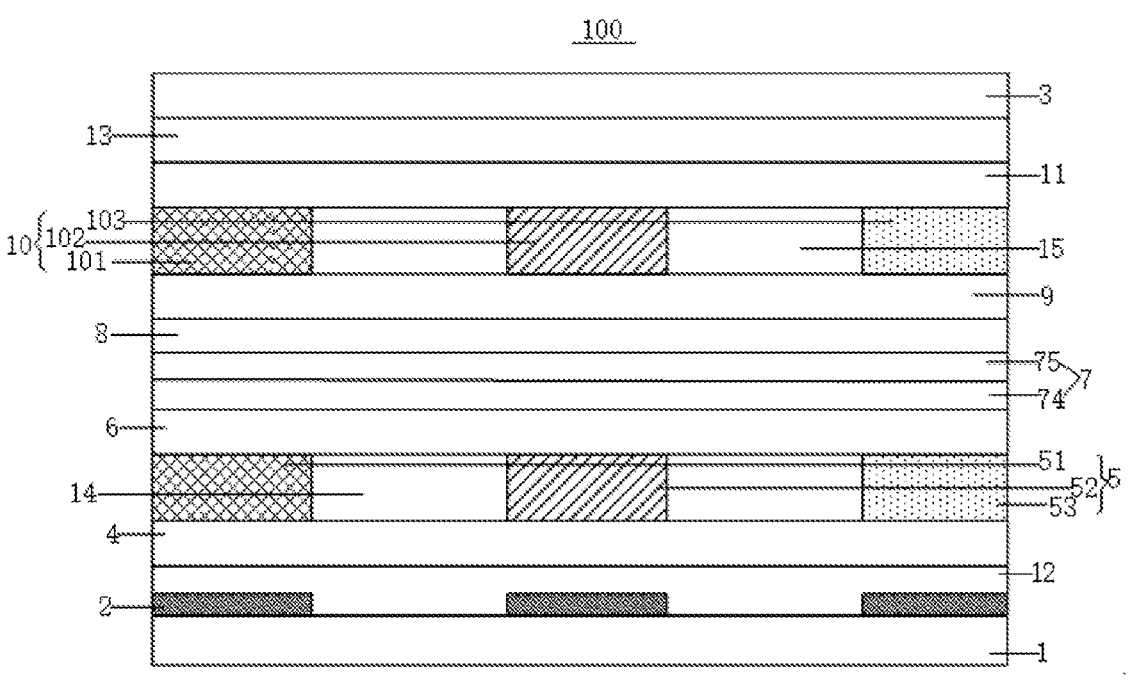
FIG. 6 is a schematic sectional view showing a structure of yet another display panel according to an embodiment of the present disclosure.

In some embodiments, referring to FIG. 6, a schematic sectional view showing a structure of yet another display panel according to an embodiment of the present disclosure is shown. The N-type charge generation layer 7 includes a first sublayer 74 and a second sublayer 75 sequentially stacked away from the substrate 1. Orthographic projections of the first sublayer 74 and the second sublayer 75 on the substrate 1 each cover the display area 100, and the first sublayer 74 and the second sublayer 75 are made of different materials.

In this embodiment, referring to FIG. 6, compared with the display panel in FIG. 2a, the two types of materials for preparing the N-type charge generation layer 7 are not doped, but form the first sublayer 74 and the second sublayer 75, respectively. That is, the first sublayer 74 and the second sublayer 75 jointly form the N-type charge generation layer 7, which can also solve the problem of operating voltage rise of the tandem OLED device with time while ensuring the efficiency of the tandem OLED device.

In some embodiments, the first sublayer 74 may include a plurality of sub-sublayers made of different materials, and the second sublayer 75 may also include a plurality of sub-sublayers made of different materials. That is, a plurality of sub-sublayers made of various materials jointly form the N-type charge generation layer 7, so that the problem of operating voltage rise of the tandem OLED device with time can also be solved while the efficiency of the tandem OLED device is ensured.

In some embodiments, the first sublayer 74 is made of a material including any one or more types of ytterbium- or lithium-doped triazine compounds or carbazole derivatives, and the second sublayer 75 is made of a material including any one or more types of ytterbium- or lithium-doped carbazole derivatives or triazine compounds.

In some embodiments, a doping concentration of ytterbium or lithium in the first sublayer 74 is in a range of 1% to 3%, and a doping concentration of ytterbium or lithium in the second sublayer 75 is in a range of 1% to 5%. The doping concentrations of ytterbium or lithium in the first sublayer 74 and the second sublayer 75 can ensure a relatively low leakage level of the tandem OLED device in the display panel.

According to the display panel provided in the embodiments of the present disclosure, by limiting the thickness of the first electron transport layer 6 to 3 nm to 10 nm, the first electron transport layer 6 has a reduced thickness compared with a display panel with a tandem OLED device structure in the existing art, which can not only effectively improve the problem of severe operating voltage rises of the display panel with time, but also reduce the differences in operating voltage rise of different colors of tandem OLED devices with time while reducing the influence on the performance of the tandem OLED devices as much as possible, so that the operating voltage rises of different colors of tandem OLED devices with time tend to be consistent, and the risk of poor display of the display panel is further reduced.

Based on the above structure of the display panel, an embodiment of the present disclosure further provides a method for preparing a display panel which includes the following steps S01 to S02. At step S01: preparing a substrate.

At step S02: sequentially preparing a first electrode, at least two emission functional layers and a second electrode on a side of the substrate.

Preparing any two adjacent ones of the at least two emission functional layers includes sequentially preparing one emission functional layer close to the substrate and the other emission functional layer away from the substrate.

preparing the one emission functional layer close to the substrate includes: sequentially preparing a first hole transport layer, a first emission layer, a first electron transport layer, and an N-type charge generation layer. The first electron transport layer has a thickness ranging from 3 nm to 10 nm.

Preparing the other emission functional layer away from the substrate includes: sequentially preparing a P-type charge generation layer, a second hole transport layer, a second emission layer, and a second electron transport layer.

In some embodiments, the method for preparing the display panel in FIG. 2a includes forming the first hole transport layer, the first electron transport layer, the N-type charge generation layer, the P-type charge generation layer, the second hole transport layer, and the second electron transport layer, respectively, through evaporating with a common metal mask (i.e., an open mask) having one opening; and forming the first emission layer and the second emission layer, respectively, through evaporating with a fine metal mask (FMM) having a plurality of openings.

Figure 7A:
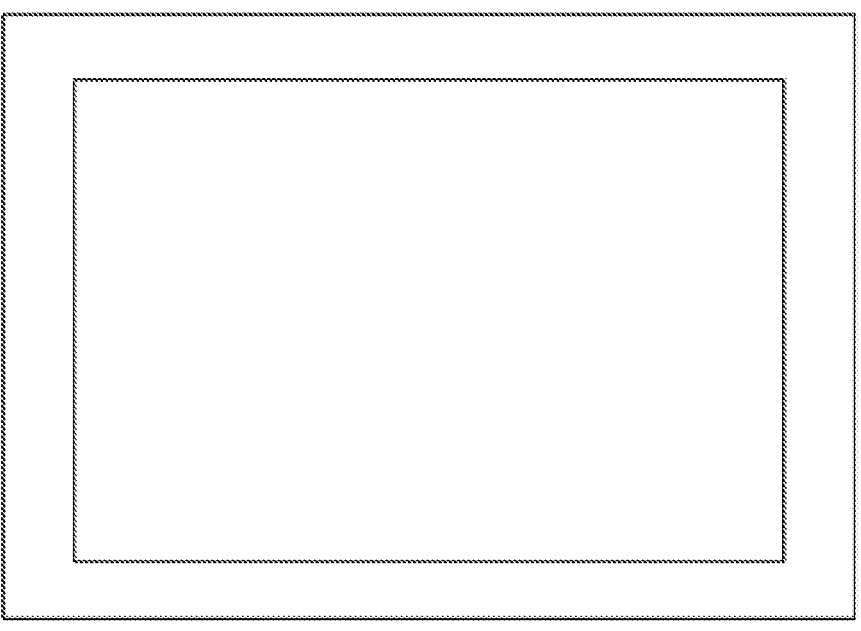
FIG. 7*a* is a schematic top view of a common metal mask.
Figure 7B:
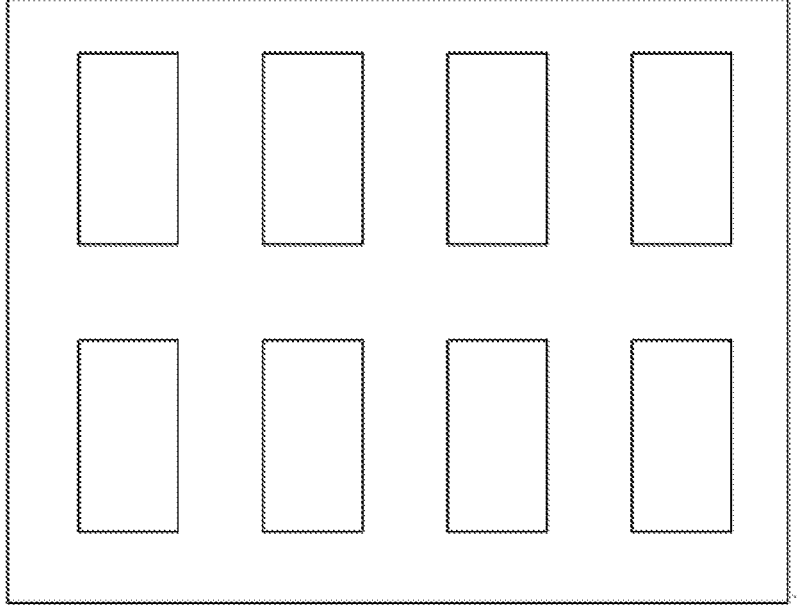
FIG. 7*b* is a schematic top view of a fine metal mask.

Referring to FIG. 7a, a schematic top view of a common metal mask is shown, where the opening in the common metal mask covers the entire display area on the substrate. Referring to FIG. 7*b*, a schematic top view of a fine metal mask is shown, where the openings in the fine metal mask correspond to formation areas (i.e., sub-pixel areas) of the tandem OLED devices on the substrate.

In some embodiments, evaporations of the first pattern, the second pattern and the third pattern in the first emission layer are respectively implemented with different fine metal masks. Evaporations of the fourth pattern, the fifth pattern and the sixth pattern in the second emission layer are respectively implemented with different fine metal masks. In some embodiments, evaporations of the fourth pattern, the fifth pattern and the sixth pattern in the second emission layer may also be implemented by the fine metal masks for evaporation for the first pattern, the second pattern and the third pattern in the first emission layer, respectively, so as to save the mask cost and the production cost.

In some embodiments, the method for preparing the display panel in FIG. 3 includes forming the first hole transport layer, the N-type charge generation layer, the P-type charge generation layer, the second hole transport layer, and the second electron transport layer, respectively, through evaporating with a common metal mask having one opening; and forming the first emission layer, the first electron transport layer, and the second emission layer, respectively, through evaporating with a fine metal mask having a plurality of openings.

In some embodiments, forming the first emission layer through evaporating with the fine metal mask having a plurality of openings includes: forming the first pattern of the first emission layer, through evaporating with a first fine metal mask: forming the second pattern of the first emission layer, through evaporating with a second fine metal mask; and forming the third pattern of the first emission layer, through evaporating with a third fine metal mask. Forming the first electron transport layer through evaporating with the fine metal mask having a plurality of openings includes: forming the first subportion of the first electron transport layer through evaporating with a first fine metal mask: forming the second subportion of the first electron transport layer, through evaporating with a second fine metal mask; and forming the third subportion of the first electron transport layer through evaporating with a third fine metal mask.

In some embodiments, evaporation for the first subportion, the second subportion, and the third subportion in the first electron transport layer in FIG. 3 may be implemented by the fine metal masks for evaporation for the first pattern, the second pattern and the third pattern in the first emission layer, respectively, so as to save the mask cost and the production cost. In some embodiments, evaporation for the first subportion in the first electron transport layer in FIG. 3 may be implemented by a newly manufactured fine metal mask, and evaporation for the second subportion and the third subportion may be implemented by a newly manufactured fine metal mask.

In some embodiments, the method for preparing the display panel in FIG. 4*a* includes forming the first electron transport layer, the P-type charge generation layer, the second hole transport layer, and the second electron transport layer, respectively, through evaporating with a common metal mask having one opening: forming the first emission layer, the second emission layer, and the N-type charge generation layer, respectively, through evaporating with a fine metal mask having a plurality of openings; and forming the first electron transport layer, through evaporating with a common metal mask having one opening.

In some embodiments, the method for preparing the display panel in FIG. 4*b* includes forming the first electron transport layer, the P-type charge generation layer, the second hole transport layer, and the second electron transport layer, respectively, through evaporating with a common metal mask having one opening: forming the first emission layer, the second emission layer, and the N-type charge generation layer, respectively, through evaporating with a fine metal mask having a plurality of openings; and forming the first electron transport layer, through evaporating with the fine metal mask having a plurality of openings.

In some embodiments, forming the first emission layer through evaporating with the fine metal mask having a plurality of openings includes: forming the first pattern of the first emission layer, through evaporating with a first fine metal mask: forming the second pattern of the first emission layer, through evaporating with a second fine metal mask; and forming the third pattern of the first emission layer, through evaporating with a third fine metal mask; and forming the N-type charge generation layer through evaporating with the fine metal mask having a plurality of openings includes: forming a first subsection of the N-type charge generation layer, through evaporating with the first fine metal mask: forming a second subsection of the N-type charge generation layer, through evaporating with the second fine metal mask; and forming a third subsection of the N-type charge generation layer, through evaporating with the third fine metal mask, so as to save the mask cost and the production cost.

In some embodiments, in the method for preparing the display panel in FIG. 2*a*, forming the N-type charge generation layer by evaporation includes: evaporating any two or more types of triazine compounds or carbazole derivatives, and ytterbium or lithium simultaneously through a plurality of evaporation sources, controlling an evaporation rate of each evaporation source, so that in the formed N-type charge generation layer, a doping ratio of a material better for improving an operating voltage rise of a tandem OLED device in the carbazole derivatives or triazine compounds is in a range of 10% to 40%, and a doping ratio of ytterbium or lithium is ≤5%.

In some embodiments, in the method for preparing the display panel in FIG. 6, forming the N-type charge generation layer by evaporation includes: sequentially forming a first sublayer and a second sublayer by evaporation.

Forming the first sublayer by evaporation includes: evaporating any one or more types of triazine compounds or carbazole derivatives, and ytterbium or lithium simultaneously through a plurality of evaporation sources; and controlling an evaporation rate of each evaporation source so that a doping concentration of ytterbium or lithium in the formed first sublayer is in a range of 1% to 3%.

Forming the second sublayer by evaporation includes: evaporating any one or more types of carbazole derivatives or triazine compounds, and ytterbium or lithium simultaneously through a plurality of evaporation sources; and controlling an evaporation rate of each evaporation source so that a doping concentration of ytterbium or lithium in the formed second sublayer is in a range of 1% to 5%.

In some embodiments, in the method for preparing the display panel in FIG. 6, the first sublayer and the second sublayer are sequentially formed, through evaporating with a common metal mask having one opening.

In some embodiments, the method for preparing a display panel further includes: after the first electrode is prepared and before preparing the first hole transport layer in one of the emission functional layers closest to the substrate, forming a hole injection layer, through evaporating with a common metal mask having one opening; and after the second electron transport layer in one of the emission functional layers farthest from the substrate is prepared and before preparing the second electrode, forming an electron injection layer, through evaporating with a common metal mask having one opening. In some embodiments, the second electrode is formed through evaporating with a common metal mask having one opening. In some embodiments, the first electrode is prepared through a patterning process (including film deposition, exposure, development, etching, and other steps).

In some embodiments, the method for preparing a display panel further includes: after the first hole transport layer is prepared and before preparing the first emission layer, preparing a first pixel defining layer through an evaporation process or an exposure process (including the steps of film coating, exposure, development, and other steps); and after the second hole transport layer is prepared and before preparing the second emission layer, preparing a second pixel defining layer through an evaporation process or an exposure process.

An embodiment of the present disclosure further provides a display apparatus, including the display panel according to any one of the above embodiments.

By adopting the display panel according to any one of the above embodiments, not only the problem of severe operating voltage rise of the display apparatus with time can be effectively improved, but also the differences in operating voltage rises of different colors of tandem OLED devices in the display apparatus with time can be reduced while the influence on the performance of the tandem OLED devices can be reduced as much as possible, so that the operating voltage rises of different colors of tandem OLED devices with time tend to be consistent, and the risk of poor display of the display apparatus is further reduced.

The display apparatus in the embodiments of the present disclosure may be any product or component with a display function, such as an OLED panel, an OLED television, an OLED billboard, a monitor, a mobile phone, a navigator, or the like.

It will be appreciated that the above implementations are merely exemplary implementations for the purpose of illustrating the principle of the present disclosure, and the present disclosure is not limited thereto. It will be apparent to those skilled in the art that various modifications and variations may be made without departing from the spirit or essence of the present disclosure. Such modifications and variations should also be considered as falling into the protection scope of the present disclosure.

What is claimed is:

1. A display panel, comprising a substrate, a first electrode, at least two emission functional layers and a second electrode, wherein the first electrode, the at least two emission functional layers, and the second electrode are sequentially stacked on a side of the substrate;

for any two adjacent ones of the at least two emission functional layers, one of the emission functional layers close to the substrate comprises a first hole transport layer, a first emission layer, a first electron transport layer, and an N-type charge generation layer, and the other of the emission functional layers away from the substrate comprises a P-type charge generation layer, a second hole transport layer, a second emission layer, and a second electron transport layer;

the first hole transport layer, the first emission layer, the first electron transport layer, the N-type charge generation layer, the P-type charge generation layer, the second hole transport layer, the second emission layer and the second electron transport layer are sequentially stacked away from the substrate;

the first electron transport layer has a thickness ranging from 3 nm to 10 nm;

the first emission layer comprises a first pattern, a second pattern, and a third pattern, wherein the first pattern, the second pattern, and the third pattern have orthographic projections on the substrate spaced apart from each other and emit light of different colors;

the first electron transport layer comprises a first subportion, a second subportion and a third subportion which have orthographic projections on the substrate spaced apart from each other, wherein orthographic projections of the first subportion and the first pattern on the substrate are overlapped, orthographic projections of the second subportion and the second pattern on the substrate are overlapped, and orthographic projections of the third subportion and the third pattern on the substrate are overlapped; and the first subportion has a thickness smaller than a thickness of the second subportion, and the first subportion has a thickness smaller than a thickness of the third subportion.

2. The display panel according to claim 1, wherein the first pattern emits blue light, the second pattern emits red light, and the third pattern emits green light, the first subportion has a thickness ranging from 3 nm to 5 nm;

the second subportion has a thickness ranging from 5 nm to 10 nm; and the third subportion has a thickness ranging from 5 nm to 10 nm.

3. The display panel according to claim 2, wherein a side surface of the first subportion away from the substrate, a side surface of the second subportion away from the substrate, and a side surface of the third subportion away from the substrate are flush.

4. The display panel according to claim 1, wherein the N-type charge generation layer comprises a first subsection, a second subsection, and a third subsection which have orthographic projections on the substrate spaced apart from each other, wherein orthographic projections of the first subsection and the first pattern on the substrate are overlapped, orthographic projections of the second subsection and the second pattern on the substrate are overlapped, and orthographic projections of the third subsection and the third pattern on the substrate are overlapped.

5. The display panel according to claim 4, wherein the first pattern emits blue light, the second pattern emits red light, and the third pattern emits green light, the first subsection is made of a material with a doping concentration of ytterbium or lithium ranging from 5% to 10%, the second subsection is made of a material with a doping concentration of ytterbium or lithium ranging from 1% to 5%, and the third subsection is made of a material with a doping concentration of ytterbium or lithium ranging from 1% to 5%.

6. The display panel according to claim 5, wherein the first subsection, the second subsection, and the third subsection have the same thickness.

7. The display panel according to claim 6, wherein side surfaces of the first subsection, the second subsection, and the third subsection away from the substrate are flush.

8. The display panel according to claim 3, wherein the first pattern has a thickness ranging from 20 nm to 30 nm; the second pattern has a thickness ranging from 45 nm to 60 nm; and
the third pattern has a thickness ranging from 30 nm to 45 nm.

9. The display panel according to claim 1, comprising a display area, wherein
an orthographic projection of the N-type charge generation layer on the substrate covers the display area, and
the N-type charge generation layer is made of a material comprising any two or more types of triazine compounds or carbazole derivatives, and ytterbium or lithium.

10. The display panel according to claim 9, wherein in the material of the N-type charge generation layer, a doping ratio of ytterbium or lithium is ≤5%, and
a doping ratio of a material better for improving an operating voltage rise of a tandem OLED device in the carbazole derivatives or triazine compounds is in a range of 10% to 40%.

11. The display panel according to claim 1, comprising a display area, wherein
the N-type charge generation layer comprises a first sublayer and a second sublayer sequentially stacked away from the substrate,
orthographic projections of the first sublayer and the second sublayer on the substrate cover the display area, and
the first sublayer and the second sublayer are made of different materials.

12. The display panel according to claim 11, wherein the first sublayer is made of a material comprising any one or more types of ytterbium- or lithium-doped triazine compounds or carbazole derivatives, and
the second sublayer is made of a material comprising any one or more types of ytterbium- or lithium-doped carbazole derivatives or triazine compounds.

13. The display panel according to claim 12, wherein a doping concentration of ytterbium or lithium in the first sublayer is in a range of 1% to 3%, and
a doping concentration of ytterbium or lithium in the second sublayer is in a range of 1% to 5%.

14. The display panel according to claim 1, comprising a display area, wherein
an orthographic projection of the first electron transport layer on the substrate covers the display area,
an orthographic projection of the second hole transport layer on the substrate covers the display area, and
the second hole transport layer has a thickness ranging from 20 nm to 40 nm.

15. The display panel according to claim 1, further comprising a hole injection layer and an electron injection layer, wherein
the hole injection layer is between the first electrode and one of the at least two emission functional layers closest to the substrate, and
the electron injection layer is on a side, of one of the at least two emission functional layers farthest from the substrate, away from the substrate.

16. The display panel according to claim 1, wherein the second emission layer comprises a fourth pattern, a fifth pattern, and a sixth pattern, wherein the fourth pattern, the fifth pattern, and the sixth pattern have orthographic projections on the substrate spaced apart from each other and emit light of different colors;
the fourth pattern and the first pattern have overlapped orthographic projections on the substrate and emit light of the same color,
the fifth pattern and the second pattern have overlapped orthographic projections on the substrate and emit light of the same color, and
the sixth pattern and the third pattern have overlapped orthographic projections on the substrate and emit light of the same color.

17. The display panel according to claim 16, further comprising a first pixel defining layer and a second pixel defining layer, wherein
the first pixel defining layer is in the same layer as the first emission layer, and has a shape complementary to the first emission layer; and
the second pixel defining layer is in the same layer as the second emission layer, and has a shape complementary to the second emission layer.

18. A display apparatus, comprising the display panel according to claim 1.

19. A method for preparing a display panel, comprising:
preparing a substrate, and
sequentially preparing a first electrode, at least two emission functional layers and a second electrode on a side of the substrate; wherein
preparing any two adjacent ones of the at least two emission functional layers comprises sequentially preparing one emission functional layer close to the substrate and the other emission functional layer away from the substrate;
preparing the one emission functional layer close to the substrate comprises: sequentially preparing a first hole transport layer, a first emission layer, a first electron transport layer, and an N-type charge generation layer;
preparing the other emission functional layer away from the substrate comprises: sequentially preparing a P-type charge generation layer, a second hole transport layer, a second emission layer, and a second electron transport layer;
the first electron transport layer has a thickness ranging from 3 nm to 10 nm;
preparing the first emission layer comprises preparing a first pattern, a second pattern, and a third pattern, wherein
the first pattern, the second pattern, and the third pattern have orthographic projections on the substrate spaced apart from each other and emit light of different colors;
preparing the first electron transport layer comprises preparing a first subportion, a second subportion, and a third subportion, wherein
the first subportion, the second subportion, and the third subportion have orthographic projections on the substrate spaced apart from each other, wherein
orthographic projections of the first subportion and the first pattern on the substrate are overlapped,
orthographic projections of the second subportion and the second pattern on the substrate are overlapped, and
orthographic projections of the third subportion and the third pattern on the substrate are overlapped; and
the first subportion has a thickness smaller than a thickness of the second subportion, and
the first subportion has a thickness smaller than a thickness of the third subportion.

20. The method according to claim 19, wherein the first hole transport layer, the first electron transport layer, the N-type charge generation layer, the P-type charge generation layer, the second hole transport layer, and the second electron transport layer are formed, respectively, through evaporating with a common metal mask having one opening; and the first emission layer and the second emission layer are formed, respectively, through evaporating with a fine metal mask having a plurality of openings.

\* \* \* \* \*